(12) United States Patent
Sakuragi et al.

(10) Patent No.: US 6,428,617 B1
(45) Date of Patent: Aug. 6, 2002

(54) METHOD AND APPARATUS FOR GROWING A SINGLE CRYSTAL IN VARIOUS SHAPES

(75) Inventors: Shiro Sakuragi, Ibaraki; Yutaka Taguchi, Tsukuba, both of (JP)

(73) Assignee: Union Material, Inc. (JP)

( * ) Notice: Subject to any disclaimer, the term of this patent is extended or adjusted under 35 U.S.C. 154(b) by 0 days.

(21) Appl. No.: 09/665,304

(22) Filed: Sep. 19, 2000

(30) Foreign Application Priority Data

Sep. 20, 1999 (JP) ............................................. 11-265521

(51) Int. Cl.[7] ............................................... C30B 13/16
(52) U.S. Cl. ............................... 117/11; 117/28; 117/81; 117/83
(58) Field of Search ............................... 117/11, 28, 81, 117/83

(56) References Cited

U.S. PATENT DOCUMENTS 5,704,974 A * 1/1998 Izunome et al. ............... 117/28
6,258,163 B1 * 7/2001 Kuragaki ...................... 117/30

* cited by examiner

*Primary Examiner*—Felisa Hiteshew
(74) *Attorney, Agent, or Firm*—Brinks Hofer Gilson & Lione

(57) ABSTRACT

The apparatus is provided with a vessel 1 for accommodating a melt 3 of material sought to be crystallized, and heaters 2 disposed symmetrically on both sides of the vessel. The vessel 1 has an interior space whose front cross section is symmetrical in shape along a vertical center line. The heaters 2 heat the vessel to create a temperature distribution in the melt in which the upper part of the vessel 1 is at a higher temperature, and the lower part thereof is at a lower temperature. The temperature distribution causes symmetrical convection flows of the melt in such a manner that two flows each move up along the side walls of the interior space of the vessel 1 and meet with each other at the top of the interior space where the vertical center line runs, and move together down along the vertical center line toward the bottom of the interior space. A single crystal is formed as the temperature at the lower end of the vessel 1 is gradually lowered below the melting point of the material.

8 Claims, 6 Drawing Sheets

FIG.5a  FIG.5b  FIG.5c
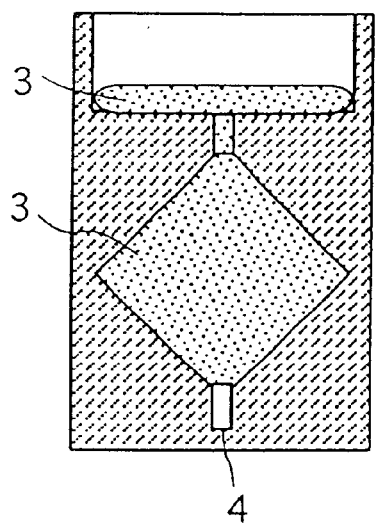 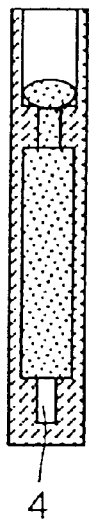 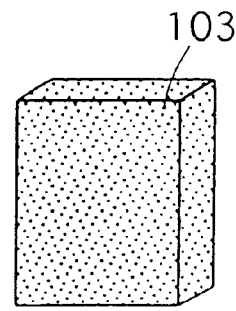
FIG.6a  FIG.6b  FIG.6c
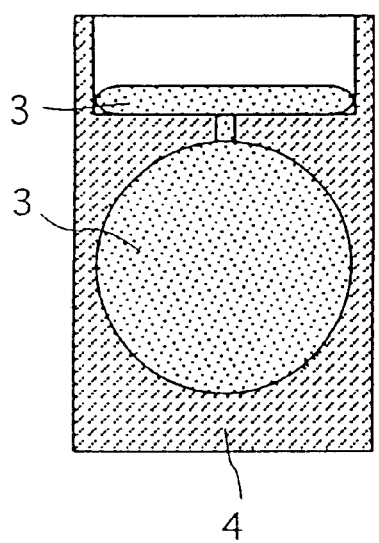 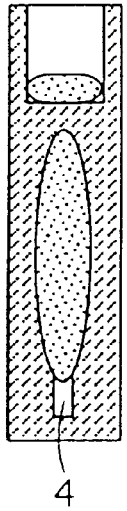 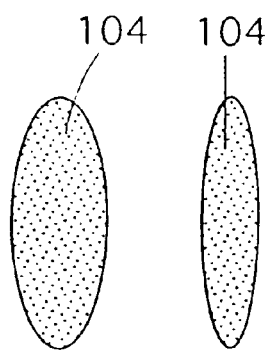

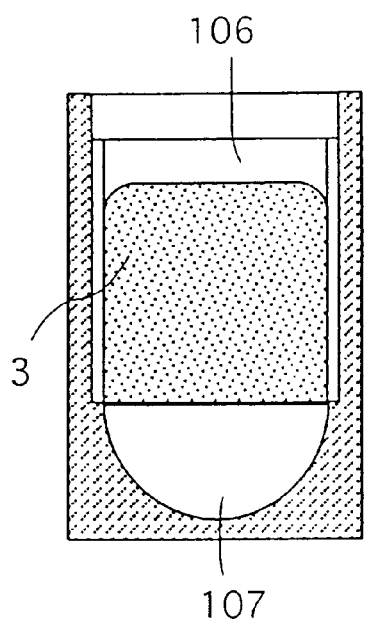
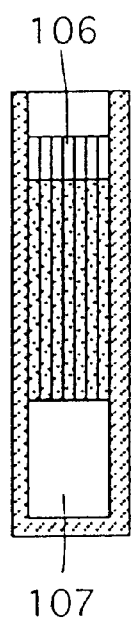
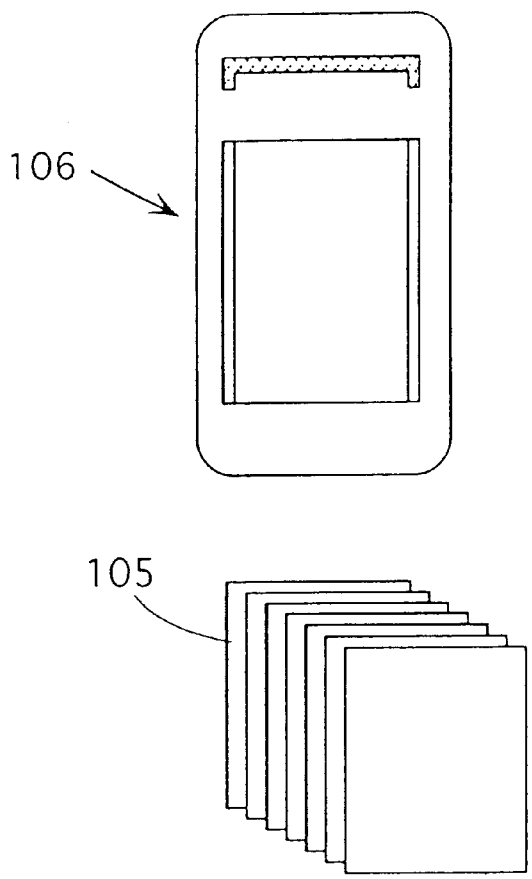
FIG. 7a  FIG. 7b  FIG. 7c  FIG. 7d

METHOD AND APPARATUS FOR GROWING A SINGLE CRYSTAL IN VARIOUS SHAPES

TECHNICAL FIELD

The present invention relates to a method for producing a single crystal and, in particular, to a method enabling production of a single crystal in various complex shapes without subjecting it to any cutting or grinding process.

BACKGROUND OF THE INVENTION

Various methods for producing single crystals are known in the art, including pull-up methods (such as the Czochralski process) and pull-down methods (such as the Bridgman technique). Under the pull-up method, a material sought to be crystallized is first placed into a crucible made of a material such as quartz or carbon and is heated into a melt. A single-crystal ingot is produced by dipping and rotating a seed crystal in the melt and gradually pulling it upward. The pull-down method utilizes a suitable temperature distribution within a furnace, wherein a melt solidifies to form a single-crystal ingot from the bottom of a furnace vessel containing the melt either by moving the vessel downward or by lowering the temperature of the furnace.

Since the single crystal produced by either of the above-described two methods is in the form of an ingot, it is necessary to cut and grind the ingot into desired shapes. This necessitates the use of a cutting apparatus and a grinding apparatus, and also requires some processing work. In addition, a certain amount of crystal is wasted in each process.

Furthermore, the cut section may be damaged during the cutting process, resulting in deterioration of the crystal quality. In order to counter this problem, it would be necessary to grind off the surfaces that have been damaged by the cutting process. But this additional process would increase the production cost.

The present invention has been made in light of the above-described problems experienced in the art. The present invention provides a method and apparatus enabling production of a single crystal in desired shapes without subjecting it to any cutting process or grinding process which may be necessary to remove surfaces damaged by the cutting process.

SUMMARY OF THE INVENTION

According to the present invention, a material sought to be crystallized is supplied into a vessel that has an interior space of a desired shape. The vessel is then heated to turn the material into a melt in such a manner as to create a temperature distribution in the melt so that symmetrical convection flows of the melt will occur within the interior space. The vessel is then gradually cooled off from the bottom of the interior space, while maintaining the symmetrical convection flows, to crystallize the melt into a shape coincident with the shape of the interior space.

The present invention makes it possible to produce a high-quality single crystal having a desired shape without subjecting it to any cutting process or grinding process that may be necessary to remove surfaces damaged by the cutting process.

BRIEF DESCRIPTION OF THE DRAWINGS

Figs. 5a, 5b and 5c are front and side cross sectional views showing a vessel according to a second embodiment of the invention and a perspective view showing a single crystal produced in the vessel;

FIGS. 6a, 6b and 6c are front and side cross sectional views showing a vessel according to a third embodiment of the invention and a perspective view showing a single crystal produced in the vessel; and FIGS. 7a, 7b and 7c are front and side cross sectional views showing a vessel according to a fourth embodiment of the invention and FIG. 7d is a perspective view showing a single crystal produced in the vessel.

DETAILED DESCRIPTION OF THE INVENTION

Embodiments of the present invention are described below with reference to the accompanying drawings.

Figure 1A:
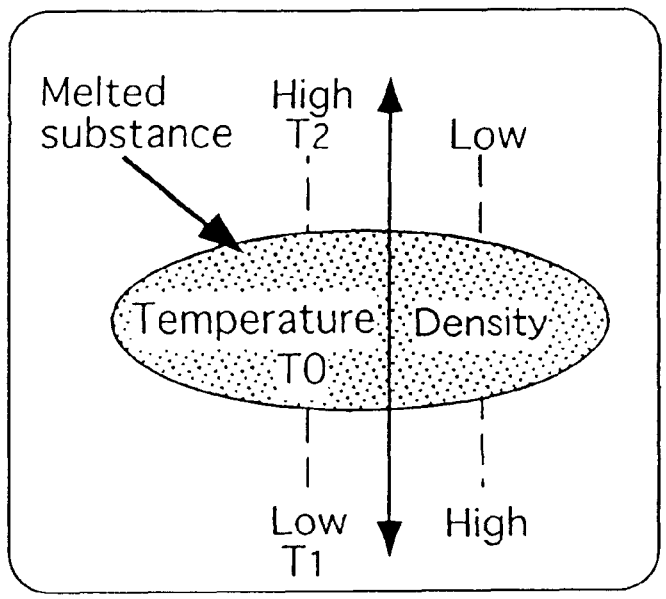
FIGS. 1a and 1b are views illustrating the principle of the present invention.
Figure 1B:
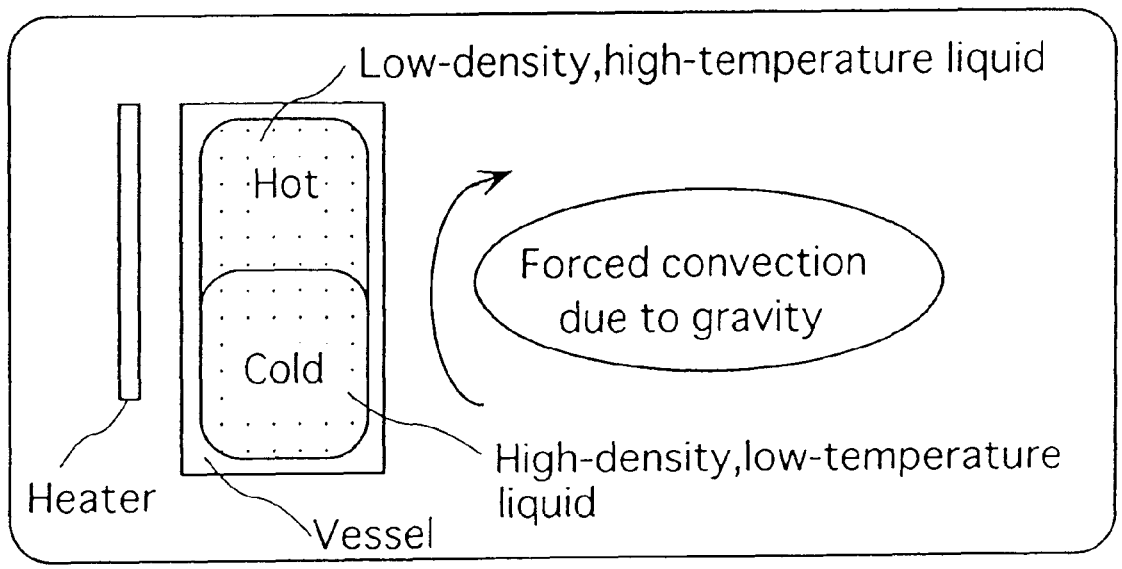

FIGS. 1a and 1b describe the principle of the present invention. As is the case for most materials, if a material is in a liquid state at reference temperature T0, the density of the liquid at higher temperature T2 is lower than that at the temperature T0 as shown in FIG. 1a. Conversely, the density of the liquid at lower temperature T1 is greater than that at the temperature T0. Due to the force of gravity acting on the liquid with such a density distribution therein, a liquid flow occurs by the effect of convection as shown in FIG. 1b, and the liquids having different temperatures are eventually mixed.

Figure 2:
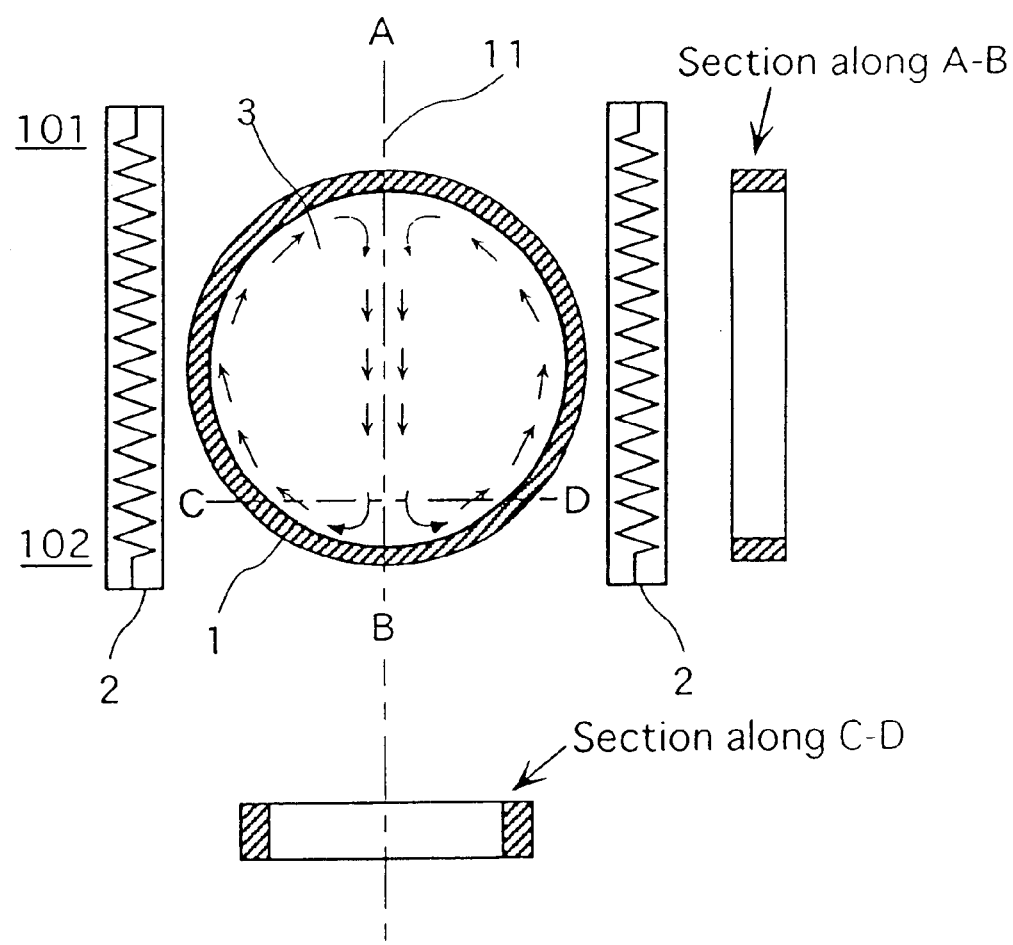
FIG. 2 is a cross sectional view of an apparatus for implementing the single-crystal production method in accordance with a first embodiment of the invention.

FIG. 2 is a front cross sectional view showing an apparatus for implementing the single-crystal production method according to a first embodiment of this invention. This apparatus is provided with a vessel 1 for accommodating a melt 3 of a material to be crystallized and heaters 2 disposed symmetrically on both sides of the vessel 1. The vessel 1 has a front cross section of a symmetrical shape. In the example shown in FIG. 2, the front cross section is circular in shape. But it may be diamond-shaped or polygonal in shape, such as rectangular, as will be described later. It should be noted, however, that if it is polygonal in shape, the polygon should stand with a vertex located at each of the upper and lower ends to ensure that symmetrical flows occurs by the effect of convection, as will be described later. If the front cross section is circular in shape, the thickness of its wall is preferably no more than 50% of the diameter. If the front cross section is in a diamond or similar shape, the thickness of the wall is preferably no more than 50% of the length of a diagonal line.

The melt of crystal within the vessel 1 is in a liquid state as shown in FIG. 2. The heaters 2 create a temperature distribution in which the upper part of the vessel 1 is at a higher temperature 101, and the lower part thereof is at a lower temperature 102 (both temperatures are above the melting point of the material 3). Melts of higher temperatures rise along the inner surfaces of the circular walls of the vessel 1. In FIG. 2, a plane running through a center vertical line (hereinafter called a "symmetrical plane") 11 divides the vessel 1 vertically into halves, wherein melt flows occur clockwise in the left half and counterclockwise in the right half. These two melt flows flowing symmetrically meet with each other at the upper end of the vessel where the symmetrical plane runs. The two flows thereafter flow downward towards the lower temperature region in the lower end of the vessel. This flow patter is called a symmetrical convection flow. In this case, the temperature of a melt in the lower end of the vessel 1 is gradually lowered to below the melting point of the material, so that the melt solidifies, in other words, it crystallizes.

Figure 3C:
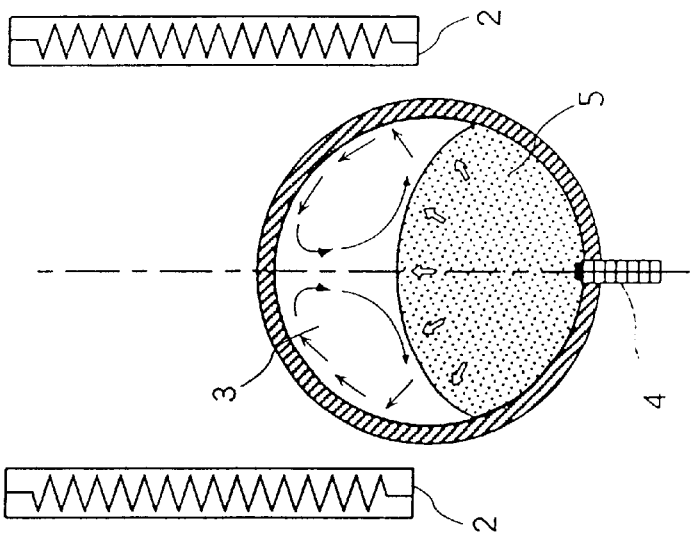
FIGS. 3a, 3b and 3c are illustrative views showing the processes of producing a single crystal, using the apparatus of FIG. 2.
Figure 3B:
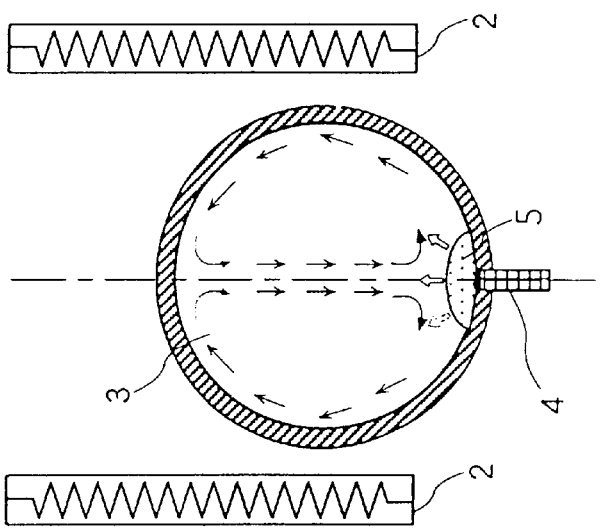
Figure 3A:
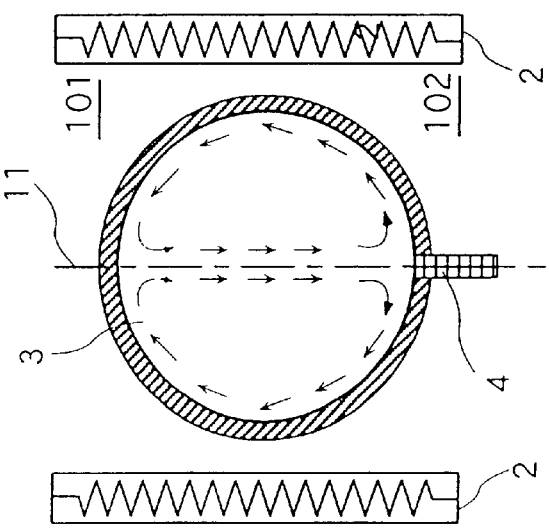

To effect crystallization in practice, a seed crystal 4 is disposed at the lower end of the vessel 1 as shown in FIG. 3a. The vessel 1 is then moved downward relative to the heaters 2 as shown in FIG. 3b, whereby a single crystal starts to grow from this seed crystal 4. A single crystal 5 can grow gradually towards the upper part of the vessel 1 by moving the vessel 1 further downward as shown in FIG. 3c. The invention in this embodiment is significant in that the boundary surface between the melt 3 and the single crystal 5 grows convex in shape since the melt flows within the vessel 1 exhibit the symmetrical pattern, making it easier for the single crystal to grow. Note that the arrows in FIGS. 3b and 3c indicate the growing directions of the crystal. It should be noted that although in the above embodiment, the vessel 1 is lowered with respect to the heaters 2 to lower the temperature of the meld in the vessel, the heater temperature may be lowered without changing the relative position between the vessel 1 and the heaters 2.

Figure 4A:
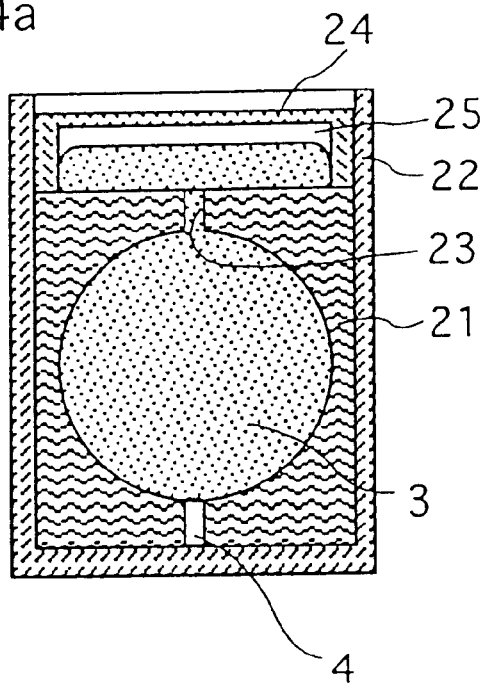
FIGS. 4a, 4b and 4c are front and side cross sectional views showing a vessel used in the apparatus shown in FIGS. 2 and 3a –3b, and a perspective view showing a single crystal produced in the vessel.
Figure 4B:
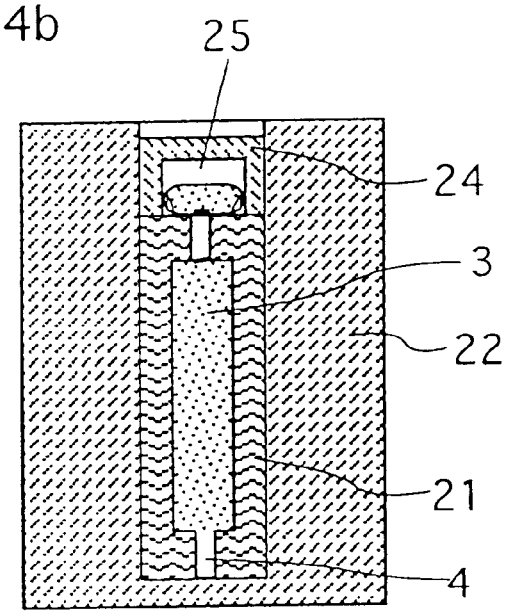
Figure 4C:
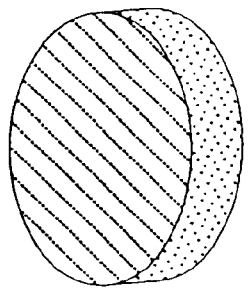

FIGS. 4a, 4b and 4c show the details of the vessel 1 of FIGS. 2 and 3a –3c and a single crystal produced by the vessel 1. More specifically, FIG. 4a is a front cross sectional view; FIG. 4b is a side cross sectional view; and FIG. 4c is a perspective view showing the produced single crystal.

As shown in FIGS. 4a and 4b, the vessel containing the melt 3 is comprised of an inner vessel 21 and an outer vessel 22. The inner vessel 21 is provided with an interior space that accommodates the melt 3 therein. This interior space is substantially in the form of a disk. The seed crystal 4 is disposed at the lower end of the space. A passageway 23 is formed to allow the melt 3 to overflow from the upper end thereof. An inner vessel lid 24 that has a substantially U-shaped cross section is placed on the upper surface of the inner vessel 21 to form a melt tank 25.

The seed crystal 4 is disposed at the lower end of the interior space of the inner vessel 21. The material sought to be crystallized is supplied into the interior space. A sufficient amount of material is supplied to ensure that the material, when melted, will overflow from the passageway 23 into the melt tank 25. Heaters (not shown in the figure) are then operated to turn the material into the melt 3 and create a temperature distribution in the melt 3 in which the upper portion is at a higher temperature and the lower portion is at a lower temperature as shown in FIG. 2. In the mean time, the seed crystal 4 also melts. The outer vessel 22 is moved downward in a manner similar to that shown in FIGS. 3b and 3c in order to crystallize the melt 3. After the crystallization has ended, the inner vessel 21 is removed from the outer vessel 22 and disassembled. A single-crystal that is disk-shaped as shown in FIG. 4c is then removed from the inner vessel 21.

A single crystal of a different shape, such as a square-shaped crystal 103, a convex lens-shaped crystal 104, or a thin-plate crystal 105, can be produced by using the inner vessel 21 with the interior space of a different shape or using the inner vessel 21 of a different configuration, as shown in FIGS. 5a –5b, 6a –6b, and 7a –7b.

More specifically, FIG. 5a is a front cross sectional view; FIG. 5b is a side cross sectional view; and FIG. 5c is a perspective view showing the square-shaped crystal 103. Likewise, FIG. 6a is a front cross sectional view; FIG. 6b is a side cross sectional view; and FIG. 6c is a side view showing two convex lens-shaped crystals 104 each having different thickness. FIG. 7a is a front cross sectional view; FIG. 7b is a side cross sectional view; and FIG. 7c is a front view showing a separator 106; and FIG. 7d is a perspective view showing the thin plate crystals 105.

It should be noted, however, that since the bottom of the interior space to which the melt is supplied is made flat as shown in FIGS. 7a and 7b, it is preferable that mirror-symmetrical convection is generated by melting approximately one-third of semidisc-shaped seed crystal 107.

The present invention described above in detail makes it possible to achieve the following effects (1) to (5):

(1) There is no cutting process necessary. Thus, no cutting apparatus is necessary. Nor is cutting time or cutting labor associated with the cutting process necessary. Also, no material is wasted that would be wasted by the cutting process.

(2) An absence of the cutting process improves the quality of a crystal that would otherwise be deteriorated due to damaged surfaces caused by the cutting process.

(3) By selecting the shape of the interior space of the vessel (crucible) used for crystal growing, a single crystal can be produced in different desired shapes, such as a disk shape, a square plate shape, a lens shape, and a thin plate shape.

(4) The symmetrical convection flow of the melt ensures that the growing of the single crystal is facilitated, and a high-quality single crystal is obtained thereby.

(5) The present invention enables production of a single crystal of any material sought to be crystallized, for instance, an optical material such as calcium fluoride or a semiconductor material such as germanium.

What is claimed is:

1. A method of producing a single crystal wherein a single crystal is produced by generating symmetrical convection flows within a vessel that accommodates a melt of a crystal material, and gradually cooling said vessel from below.

2. A method of producing a single crystal as defined in claim 1, wherein said vessel has plane symmetry about a plane surface comprising a vertical line, and is also provided with an internal space of a shape having an upper end and a lower end at positions on said plane surface.

3. A method of producing a single crystal as defined in claim 2, wherein heaters are disposed on outer sides of said vessel on two sides of said plane surface, to cause the generation of said mirror-symmetrical convection by creating a temperature gradient which is high at an upper end and low at a lower end thereof.

4. A method of producing a single crystal comprising the steps of:

supplying a material sought to be crystallized into a vessel that has an interior space of a certain shape;

heating the vessel to turn the material into a melt in such a manner as to create a temperature distribution in the melt so that symmetrical convection flows of the melt will occur within the interior space; and gradually cooling off the vessel from the bottom of the interior space, while maintaining the symmetrical convection flows, to crystallize the melt into a shape coincident with the shape of the interior space.

5. A method of producing a single crystal as defined in claim 4, further comprising the step of placing a crystal seed at the bottom of the interior space.

6. A method of producing a single crystal as defined in claim 4, wherein said step of gradually cooling off the vessel from the bottom of the interior space is implemented by moving the vessel so as to move the lower part of the vessel away from a heat source.

7. A method of producing a single crystal as defined in claim 4, wherein said step of gradually cooling off the vessel from the bottom of the interior space is implemented by lowering heating temperature.

8. A method of producing a single crystal as defined in claim 4, wherein the interior space has a front cross section of a shape symmetrical along a vertical center line, and the symmetrical convection flows occurs in such a manner that two flows each move up along respective side walls of the interior space and meet with each other at the top of the interior space where the vertical center line runs, and move down together along the vertical center line.

* * * * *

UNITED STATES PATENT AND TRADEMARK OFFICE
CERTIFICATE OF CORRECTION

PATENT NO. : 6,428,617 B1
DATED : August 6, 2002
INVENTOR(S) : Shiro Sakuragi et al.

It is certified that error appears in the above-identified patent and that said Letters Patent is hereby corrected as shown below:

Title page,
Item [75], Inventors, delete "Ibaraki" and substitute -- Kitasoma-gun -- in its place; and delete "Tsukuba" and substitute -- Tsukuba-shi -- in its place.
Item [73], Assignee, after "Material, Inc." insert -- and Shikoku Instrumentation Co., Ltd. --.

Signed and Sealed this

Eighteenth Day of May, 2004

JON W. DUDAS
*Acting Director of the United States Patent and Trademark Office*